US012224260B2

(12) United States Patent
Choi et al.

(10) Patent No.: US 12,224,260 B2
(45) Date of Patent: Feb. 11, 2025

(54) SEMICONDUCTOR PACKAGE INCLUDING A DUALIZED SIGNAL WIRING STRUCTURE

(71) Applicant: SAMSUNG ELECTRONICS CO., LTD., Suwon-si (KR)

(72) Inventors: Heejung Choi, Seongnam-si (KR); Heeseok Lee, Suwon-si (KR); Junso Pak, Seongnam-si (KR); Bongwee Yu, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 122 days.

(21) Appl. No.: 17/542,667

(22) Filed: Dec. 6, 2021

(65) Prior Publication Data

US 2022/0181288 A1  Jun. 9, 2022

(30) Foreign Application Priority Data

Dec. 9, 2020 (KR) .................... 10-2020-0171378
Mar. 30, 2021 (KR) .................... 10-2021-0041260

(51) Int. Cl.
*H01L 23/00* (2006.01)
*H01L 23/498* (2006.01)
*H01L 25/10* (2006.01)

(52) U.S. Cl.
CPC ........ *H01L 24/20* (2013.01); *H01L 23/49816* (2013.01); *H01L 23/49827* (2013.01); *H01L 24/16* (2013.01); *H01L 25/105* (2013.01); H01L 2224/16227 (2013.01); H01L 2224/211 (2013.01); H01L 2225/107 (2013.01)

(58) Field of Classification Search
CPC ......... H01L 23/49816; H01L 23/49827; H01L 23/5389; H01L 23/3107; H01L 23/5385; H01L 2224/16227; H01L 2225/107; H01L 2924/15174

See application file for complete search history.

(56) References Cited

U.S. PATENT DOCUMENTS

| | | |
|---|---|---|
| 8,062,968 B1 | 11/2011 | Conn |
| 8,125,066 B1 | 2/2012 | Kang |
| 8,659,139 B2 | 2/2014 | Crisp et al. |
| 8,659,141 B2 | 2/2014 | Crisp et al. |
| 9,209,163 B2 | 12/2015 | Kao et al. |
| 10,665,574 B2 | 5/2020 | Im et al. |
| 2012/0211885 A1* | 8/2012 | Choi .................. H01L 25/105 257/737 |
| 2015/0041979 A1 | 2/2015 | Goudarzi |
| 2018/0294228 A1* | 10/2018 | Hsieh .................. H01L 21/486 |
| 2018/0350706 A1 | 12/2018 | Wang et al. |
| 2019/0088621 A1* | 3/2019 | Yang .................. H01L 23/538 |

(Continued)

*Primary Examiner* — Dale E Page
*Assistant Examiner* — Lawrence C Tynes, Jr.
(74) *Attorney, Agent, or Firm* — F. CHAU & ASSOCIATES, LLC

(57) ABSTRACT

A semiconductor package including: a plurality of lower pads; an upper pad; a semiconductor chip including a chip pad and configured to transmit or receive a first signal through the chip pad; a first wiring structure connecting the chip pad to a first lower pad among the plurality of lower pads; and a second wiring structure connecting a second lower pad among the plurality of lower pads to the upper pad, wherein the first lower pad and the second lower pad are separated from each other by a minimum distance between the plurality of lower pads.

18 Claims, 13 Drawing Sheets

(56) References Cited

U.S. PATENT DOCUMENTS

| | | | | |
|---|---|---|---|---|
| 2019/0148276 A1* | 5/2019 | Chen | .................... | H01L 21/486 |
| | | | | 257/774 |
| 2019/0377402 A1* | 12/2019 | Chao | .................... | G06F 1/3275 |
| 2020/0176387 A1* | 6/2020 | Yu | ...................... | H01L 21/6835 |
| 2020/0176432 A1* | 6/2020 | Huang | .................... | H01L 25/18 |
| 2020/0381325 A1* | 12/2020 | Huang | ............... | H01L 25/0655 |
| 2021/0005592 A1* | 1/2021 | Lee | .................... | H01L 23/5389 |
| 2021/0202392 A1* | 7/2021 | Kung | .................. | H01L 25/105 |
| 2021/0375768 A1* | 12/2021 | Tsou | ............... | H01L 23/49838 |

* cited by examiner

SEMICONDUCTOR PACKAGE INCLUDING A DUALIZED SIGNAL WIRING STRUCTURE

CROSS-REFERENCE TO RELATED APPLICATIONS

This application claims priority under 35 U.S.C. § 119 to Korean Patent Application Nos. 10-2020-0171378, filed on Dec. 9, 2020, and 10-2021-0041260, filed on Mar. 30, 2021, in the Korean Intellectual Property Office, the disclosures of which are incorporated by reference herein in their entireties.

TECHNICAL FIELD

The present inventive concept relates to a semiconductor package, and more particularly, to a semiconductor package including a dualized signal wiring structure.

DISCUSSION OF THE RELATED ART

Along with the rapid progress of the electronics industry and desires of users, electronic devices have been continuously desired to be miniaturized, have multiple functions, and have a large capacity (e.g., storage capacity, processing power, etc.), and accordingly, a semiconductor package including a plurality of semiconductor chips has been used. Along with high integration of a plurality of semiconductor chips included in a semiconductor package, a printed circuit board has not frequently accommodated the high integration of the plurality of semiconductor chips. Accordingly, a semiconductor package, in which a plurality of semiconductor chips are vertically stacked or connected to each other by using an interposer, has been under development.

SUMMARY

According to an exemplary embodiment of the present inventive concept, a semiconductor package includes a plurality of lower pads, an upper pad, a semiconductor chip including a chip pad and configured to transmit or receive a first signal through the chip pad, a first wiring structure connecting the chip pad to a first lower pad among the plurality of lower pads, and a second wiring structure connecting a second lower pad among the plurality of lower pads to the upper pad, wherein the first lower pad and the second lower pad are separated from each other by a minimum distance between the plurality of lower pads.

According to an exemplary embodiment of the present inventive concept, a semiconductor package includes a substrate, a first package including a plurality of lower pads, an upper pad, and a first semiconductor chip including a first chip pad and configured to transmit or receive a pre-defined signal through the first chip pad, and mounted on the substrate, and a second package including a second semiconductor chip controlled by the first semiconductor chip and configured to transmit or receive a pre-defined signal through a second chip pad of the second semiconductor chip, and mounted on the first package or the substrate, wherein the first package includes a first wiring structure connecting the first chip pad to a first lower pad among the plurality of lower pads, and a second wiring structure connecting a second lower pad among the plurality of lower pads to the upper pad and transferring the pre-defined signal.

According to an exemplary embodiment of the present inventive concept, a semiconductor package includes a plurality of lower pads, an upper pad, a semiconductor chip including a chip pad and configured to transmit or receive a first signal through the chip pad, a first wiring structure connecting the chip pad to a first lower pad among the plurality of lower pads, and a second wiring structure connecting a second lower pad among the plurality of lower pads to the upper pad, wherein the first and second lower pads are physically separated from each other in the semiconductor package, and the first wiring structure and the second wiring structure are physically separated from each other in the semiconductor package.

BRIEF DESCRIPTION OF THE DRAWINGS

The above and other aspects of the present inventive concept will become more apparent by describing in detail embodiments thereof, with reference to the accompanying drawings, in which.

DETAILED DESCRIPTION OF THE EMBODIMENTS

Hereinafter, exemplary embodiments of the present inventive concept will be described with reference to the accompanying drawings.

Figure 1A:
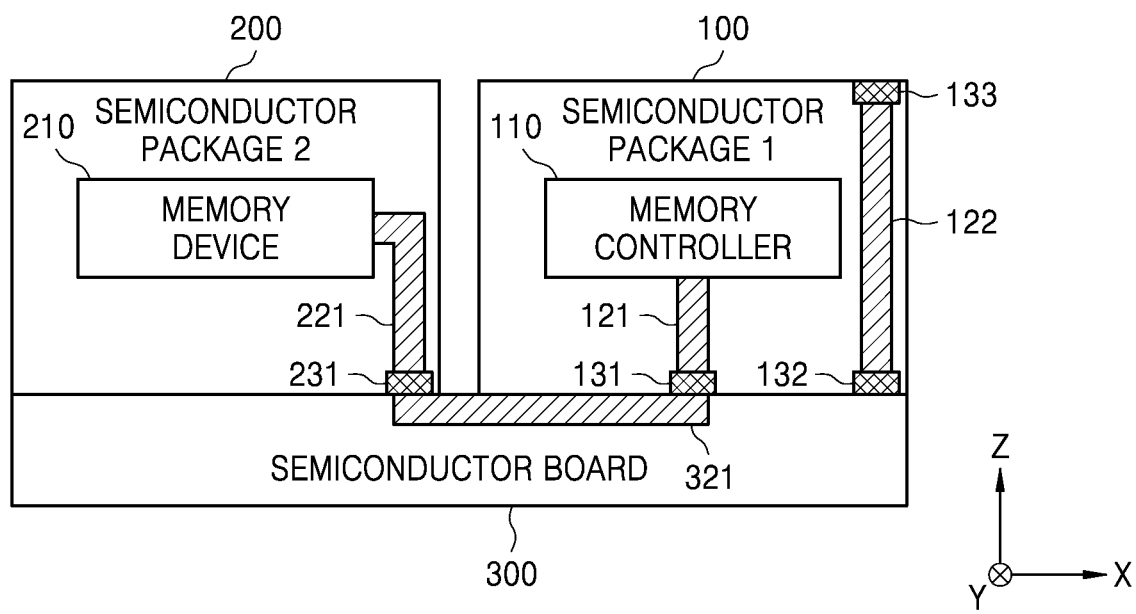
FIGS. 1A and 1B are cross-sectional views of semiconductor packages according to exemplary embodiments of the present inventive concept.
Figure 1B:
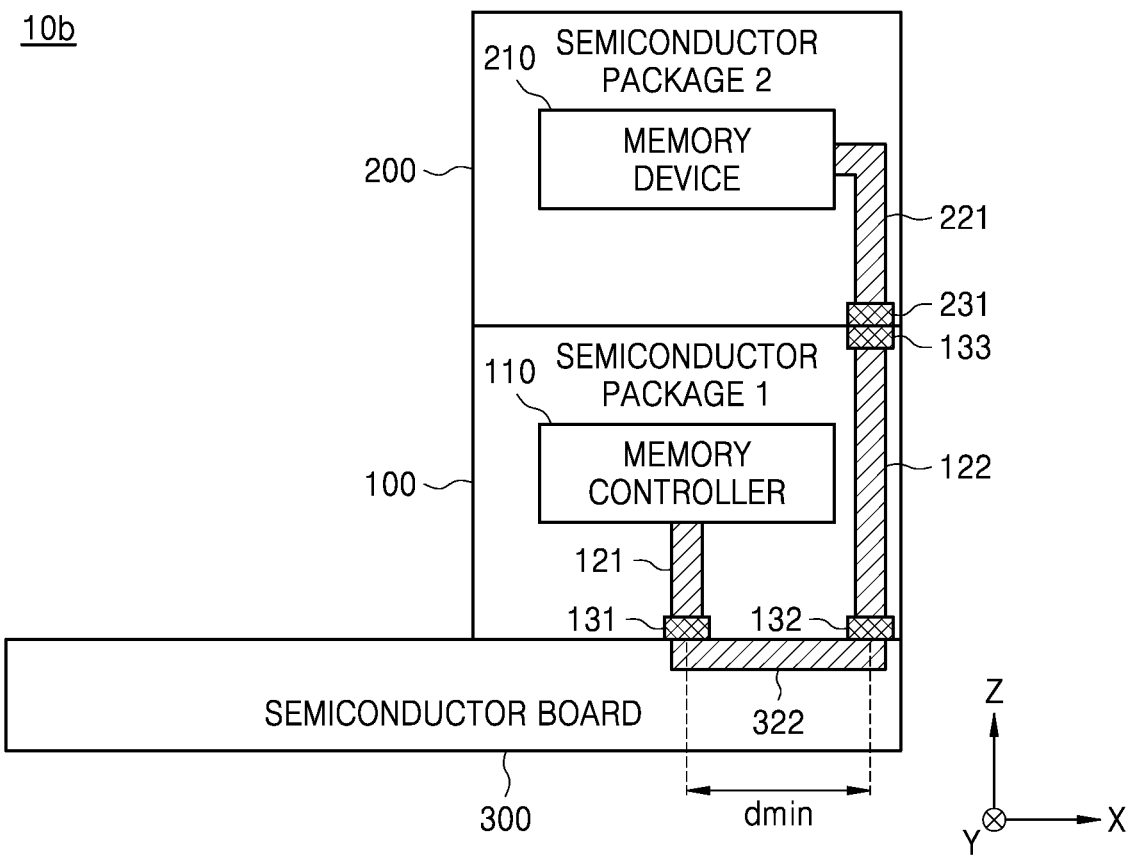

FIGS. 1A and 1B are cross-sectional views of semiconductor packages according to exemplary embodiments of the present inventive concept. For example, FIG. 1A is a cross-sectional view of a semiconductor package 10a including a first semiconductor package 100 and a second semiconductor package 200 mounted on a semiconductor substrate 300, and FIG. 1B is a cross-sectional view of a semiconductor package 10b including the second semiconductor package 200 mounted on a first semiconductor package 100. Hereinafter, a description to be made with reference to FIG. 1A may also be applied to FIG. 1B. A plane formed by an X-axis and a Y-axis may be referred to as a horizontal plane. A component arranged above a different component may be considered to be arranged in a +Z direction with respect to the different component, and a component arranged under a different component may be considered to be arranged in a −Z direction with respect to the different component.

Referring to FIG. 1A, the semiconductor package 10a may include the first semiconductor package 100, the second semiconductor package 200, and the semiconductor board 300. The first semiconductor package 100 includes a memory controller 110, and the second semiconductor package 200 includes a memory device 210. Referring to FIG. 1A, the first semiconductor package 100 and the second semiconductor package 200 may be mounted on the semiconductor board 300.

For example, the semiconductor package 10*a* may be implemented to be included in a personal computer (PC) or a mobile electronic device. For example, the mobile electronic device may be a laptop computer, a mobile phone, a smartphone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile Internet device (MID), a wearable computer, an Internet of Things (IoT) device, an Internet of Everything (IoE) device, or a drone.

The memory controller 110 may control an operation of the memory device 210. For example, the memory controller 110 may be implemented by an integrated circuit (IC), a system on chip (SoC), an application processor (AP), a mobile AP, a chipset, or a set of chips. For example, the memory controller 110 may include random access memory (RAM), a central processing unit (CPU), a graphics processing unit (GPU), and/or a modem. The memory controller 110 may support a multimedia card (MMC) interface, an embedded MMC (eMMC) interface, and a universal flash storage (UFS) interface but is not limited thereto.

For example, the memory device 210 may be implemented by a nonvolatile memory device. For example, the memory device 210 may be implemented by electrically erasable programmable read-only memory (EEPROM), flash memory, magnetic random access memory (MRAM), spin-transfer torque MRAM (STT-MRAM), ferroelectric RAM (FeRAM), phase change RAM (PRAM), resistive RAM (RRAM), nanotube RRAM, polymer RAM (PoRAM), a nano floating gate memory (NFGM), a holographic memory, a molecular electronics memory device, an insulator resistance change memory, or the like.

According to an exemplary embodiment of the present inventive concept, the memory device 210 may include a volatile memory device. For example, the volatile memory device may be implemented by RAM, dynamic RAM (DRAM), or static RAM (SRAM) but is not limited thereto. For example, the memory device 210 may include wide input/output (I/O) DRAM, low power double data rate (LPDDR) DRAM, or the like.

The first semiconductor package 100 may include a first wiring structure 121 and a second wiring structure 122. The first wiring structure 121 may connect a connection terminal (e.g., a chip pad or a solder ball) of the memory controller 110 to a first lower pad 131 formed on a lower surface of the first semiconductor package 100. The second wiring structure 122 may connect a second lower pad 132 formed on the lower surface of the first semiconductor package 100 to an upper pad 133 formed on an upper surface of the first semiconductor package 100.

For example, the first wiring structure 121 and the second wiring structure 122 may be multiplexed to transfer the same type of signal. The first and second lower pads 131 and 132 may be used for the same type of signal. For example, the first and second lower pads 131 and 132 may be exclusively used for the same type of signal. For example, the first wiring structure 121 and the second wiring structure 122 may be multiplexed to transfer a clock signal CK, and the first and second lower pads 131 and 132 may be exclusively used for the clock signal CK. Therefore, only the clock signal CK may flow through the first and second wiring structures 121 and 122 and the first and second lower pads 131 and 132. The first wiring structure 121 and the second wiring structure 122 may be physically separated from each other in the first semiconductor package 100.

The second semiconductor package 200 may include a third wiring structure 221. The third wiring structure 221 may connect a connection terminal (e.g., a chip pad or a solder ball) of the memory device 210 to a lower pad 231 formed on a lower surface of the second semiconductor package 200.

Referring to FIG. 1A, the semiconductor board 300 may include a fourth wiring structure 321 forming a signal path between the memory controller 110 and the memory device 210. As shown in FIG. 1A, when the second semiconductor package 200 is mounted on the semiconductor board 300, the fourth wiring structure 321 may electrically connect the first wiring structure 121 to the third wiring structure 221. In other words, the memory controller 110 may be connected to the memory device 210. For example, the memory controller 110 and the memory device 210 may exchange a pre-defined type of signal through the first, third, and fourth wiring structures 121, 221, and 321. When the second semiconductor package 200 is mounted on the semiconductor board 300, the second wiring structure 122 might not be used to transfer the pre-defined type of signal.

Referring to FIG. 1B, the semiconductor board 300 may include a fifth wiring structure 322 forming a path between the memory controller 110 and the memory device 210. As shown in FIG. 1B, when the second semiconductor package 200 is mounted on the first semiconductor package 100, the fifth wiring structure 322 may electrically connect the first wiring structure 121 to the second wiring structure 122. The second wiring structure 122 may be electrically connected to the third wiring structure 221. In other words, the memory controller 110 is connected to the memory device 210. For example, the memory controller 110 and the memory device 210 may exchange a pre-defined type of signal through the first, second, third, and fifth wiring structures 121, 122, 221, and 322.

Referring to FIG. 1B, the first lower pad 131 and the second lower pad 132 may be separated from each other by a minimum distance dmin. The minimum distance dmin may be a minimum distance between external connection terminals (e.g., solder balls) formed on the lower surface of the first semiconductor package 100. Therefore, a signal path may be shortened so that the memory controller 110 and the memory device 210 may stably exchange the pre-defined type of signal.

Referring to FIGS. 1A and 1B, the first and second wiring structures 121 and 122 are selectively connected according to a position where the second semiconductor package 200 is mounted, and thus, a stub structure might not be formed on a signal path between the memory controller 110 and the memory device 210. For example, regardless of a position where the second semiconductor package 200 is mounted, the memory controller 110 and the memory device 210 may exchange a signal through a signal path without a stub structure. The stub structure may indicate an additional wiring formed on a main path through which a signal is transferred.

Figure 2A:
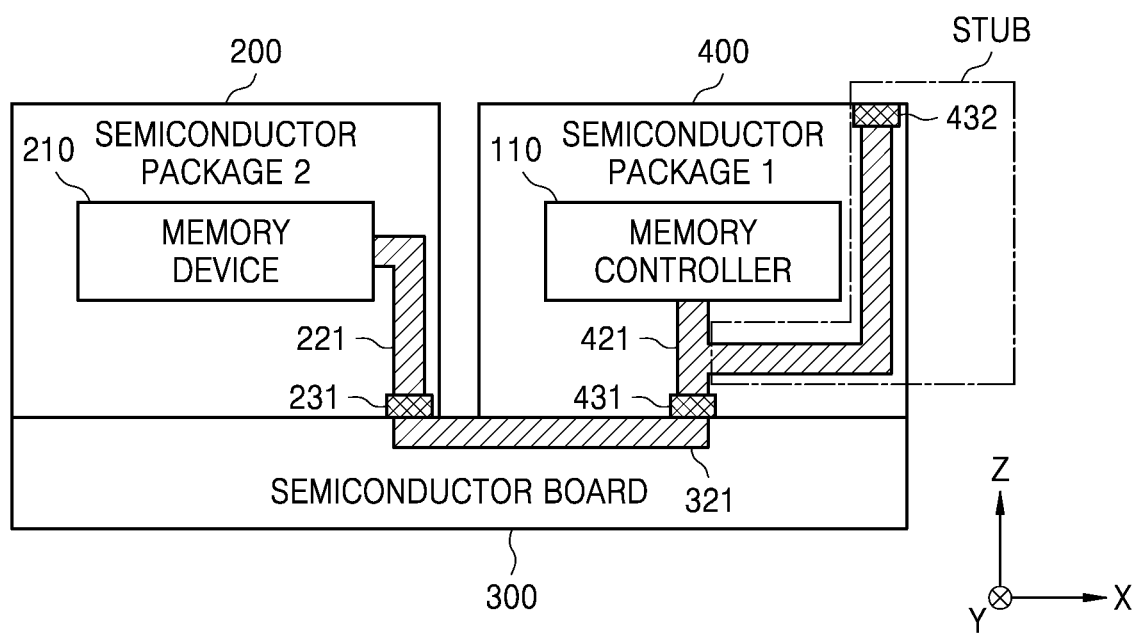
FIGS. 2A and 2B are cross-sectional views of semiconductor packages illustrating a stub structure, according to comparative examples.
Figure 2B:
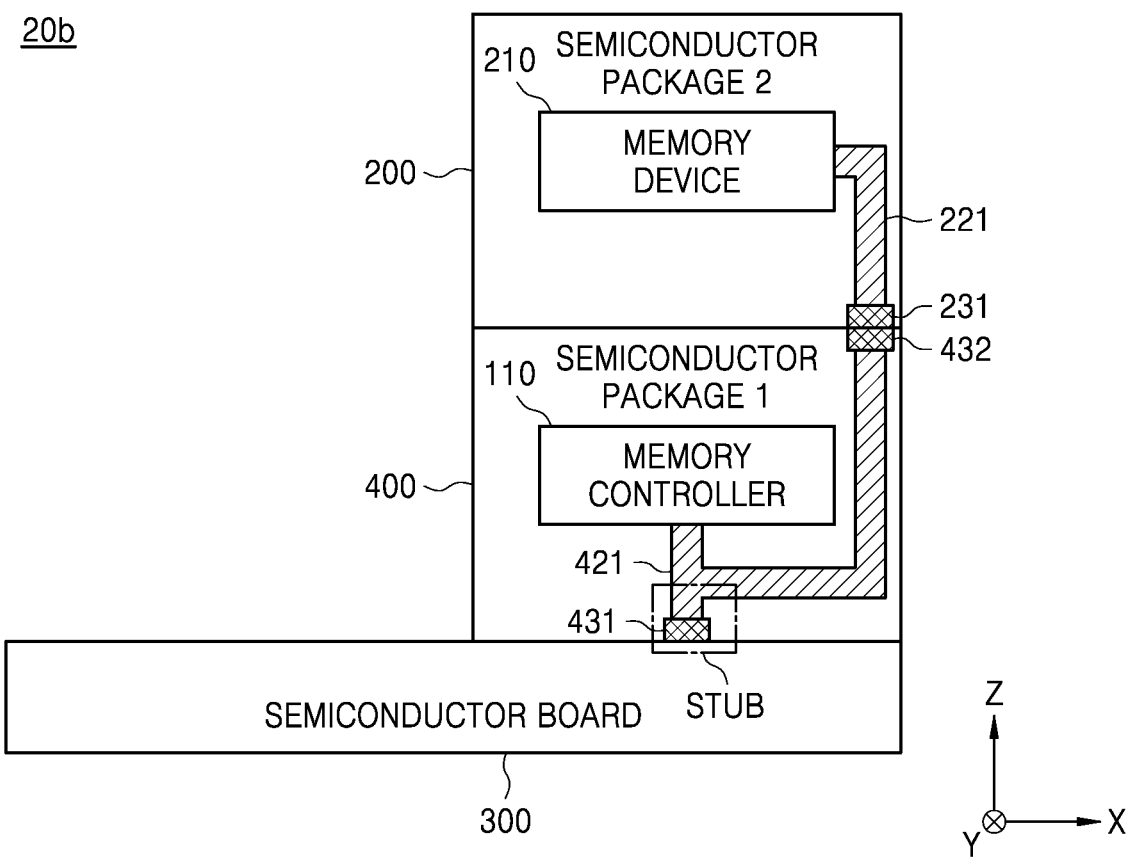

FIGS. 2A and 2B are cross-sectional views of semiconductor packages to describe a stub structure, according to comparative examples. FIG. 2A is a cross-sectional view of a semiconductor package 20*a* including the first semiconductor package 400 and the second semiconductor package 200 mounted on the semiconductor substrate 300, and FIG. 2B is a cross-sectional view of a semiconductor package 20b including the second semiconductor package 200 mounted on a first semiconductor package 400.

Referring to FIGS. 2A and 2B, the first semiconductor package 400 may include a first wiring structure 421. The first wiring structure 421 may connect a connection terminal (e.g., a chip pad or a solder ball) of the memory controller 110 to a lower pad 431 formed on a lower surface of the first semiconductor package 400. In addition, the first wiring structure 421 may be branched inside the first semiconductor package 400 to be connected to an upper pad 432 formed on an upper surface of the first semiconductor package 400. For example, the first wiring structure 421 may include a first portion connected to the connection terminal of the memory controller 110 and a second portion connected to the upper pad 432 and the first portion.

As shown in FIG. 2A, when the second semiconductor package 200 is mounted on the semiconductor board 300, the fourth wiring structure 321 may electrically connect the first wiring structure 421 to the third wiring structure 221. For example, the memory controller 110 and the memory device 210 may exchange a pre-defined type of signal through the first, third, and fourth wiring structures 421, 221, and 321. To transfer a signal of the memory controller 110 to both the lower pad 431 and the upper pad 432, the first wiring structure 421 is branched or divided into a first portion and a second portion inside the first semiconductor package 400, and thus, a stub structure STUB, regardless of signal exchange, may be formed from a branching point to the upper pad 432. The stub structure may cause generation of a reflective signal, and the reflective signal may distort a signal to be exchanged between the memory controller 110 and the memory device 210.

As shown in FIG. 2B, when the second semiconductor package 200 is mounted on the first semiconductor package 400, the first wiring structure 421 may be electrically connected to the third wiring structure 221. For example, the memory controller 110 and the memory device 210 may exchange a pre-defined type of signal through the first and third wiring structures 421 and 221. A stub structure STUB, regardless of signal exchange, may be formed from a branching point to the lower pad 431. The stub structure may cause generation of a reflective signal, and the reflective signal may distort a signal exchanged between the memory controller 110 and the memory device 210.

Unlike the semiconductor packages 20a and 20b shown in FIGS. 2A and 2B, the semiconductor packages 10a and 10b shown in FIGS. 1A and 1B include a stubless wiring structure and thus may exchange a signal of which distortion is minimized.

Figure 3:
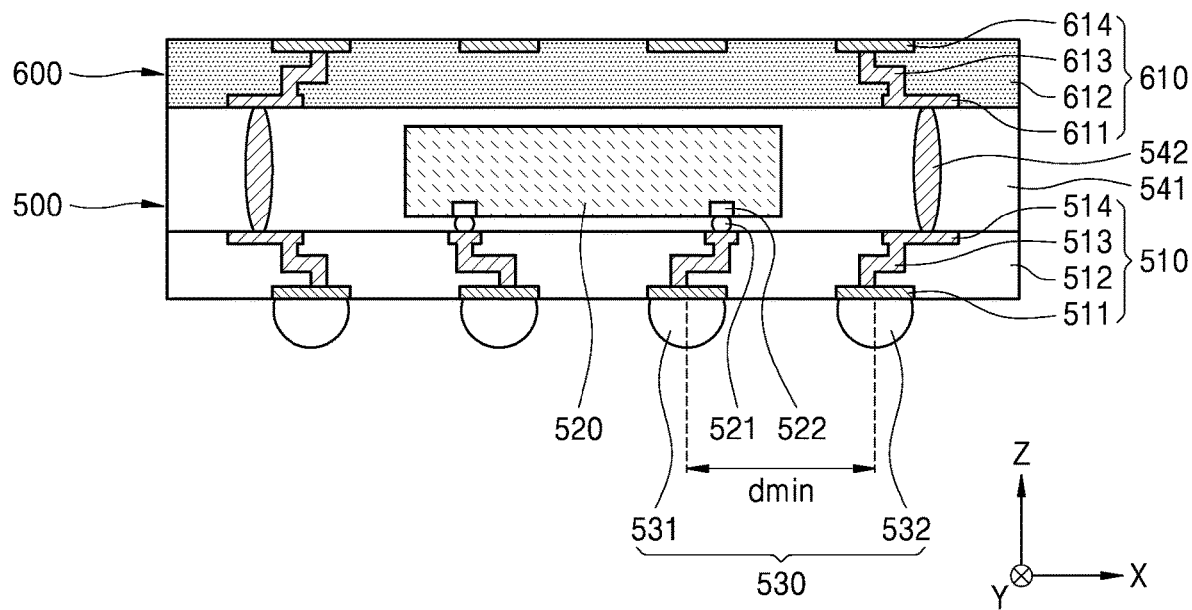
FIG. 3 is a cross-sectional view of a first semiconductor package according to an exemplary embodiment of the present inventive concept.

FIG. 3 is a cross-sectional view of a first semiconductor package 30 according to an exemplary embodiment of the present inventive concept. For example, the first semiconductor package 30 of FIG. 3 may be an example of the first semiconductor package 100 of FIGS. 1A and 1B.

Referring to FIG. 3, the first semiconductor package 30 may include a lower package 500, an interposer 600 on the lower package 500, and a conductive connector 542 electrically connecting the lower package 500 to the interposer 600.

The lower package 500 may include a package substrate 510, a semiconductor chip 520, and a molding layer 541. The lower package 500 may be, for example, a flip-chip package in which the semiconductor chip 520 is mounted on the package substrate 510 in a face-down manner. In this case, a chip connection terminal 521 is arranged between a chip pad 522 of the semiconductor chip 520 and a substrate upper pad 514 of the package substrate 510, and the chip connection terminal 521 may electrically/physically connect the chip pad 522 of the semiconductor chip 520 to the substrate upper pad 514 of the package substrate 510.

The package substrate 510 may include a substrate base 512 made of at least one of a phenol resin, an epoxy resin, and/or polyimide. In addition, the package substrate 510 may include the substrate upper pad 514 and a substrate lower pad 511 respectively formed on an upper surface and a lower surface of the substrate base 512. An internal wiring 513 electrically connecting the substrate upper pad 514 to the substrate lower pad 511 may be formed inside the substrate base 512.

The substrate upper pad 514 and the substrate lower pad 511 may include, for example, a metal such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru) or an alloy thereof, but the present inventive concept is not limited thereto.

The substrate upper pad 514 may be a pad to which the conductive connector 542 is attached or may be a pad to which the chip connection terminal 521 is attached. In addition, the substrate lower pad 511 may function as a pad to which an external connection terminal 530 is attached. The substrate lower pad 511 may be an example of the first and second lower pads 131 and 132 described above with reference to FIGS. 1A and 1B. The external connection terminal 530 may be, for example, a solder ball or a bump. The external connection terminal 530 may electrically connect the first semiconductor package 30 to an external device.

The semiconductor chip 520 may be mounted on the package substrate 510. The semiconductor chip 520 may include a semiconductor substrate having an active surface and an inactive surface that are opposite to each other, and include a semiconductor device layer formed on the active surface of the semiconductor substrate. The semiconductor chip 520 may include a lower surface and an upper surface that are opposite to each other, and the chip pad 522 may be provided on the lower surface of the semiconductor chip 520. The chip pad 522 of the semiconductor chip 520 may be electrically connected to the semiconductor device layer through a wiring structure.

The semiconductor chip 520 may be a non-memory chip. For example, the semiconductor chip 520 may be a logic chip and may be implemented in, for example, an artificial intelligence semiconductor, a microprocessor, a graphics processor, a signal processor, a network processor, a chipset, an audio codec, a video codec, an AP, or an SoC but the present inventive concept is not limited thereto. The semiconductor chip 520 may correspond to the memory controller 110 described above with reference to FIGS. 1A to 2B.

In an exemplary embodiment of the present inventive concept, the semiconductor chip 520 may be a memory chip and may include a volatile memory chip and/or a nonvolatile memory chip. The volatile memory chip may include, for example, DRAM, SRAM, thyristor RAM (TRAM), zero capacitor RAM (ZRAM), or twin transistor RAM (TTRAM). In addition, the nonvolatile memory chip may include, for example, flash memory, MRAM, STT-MRAM, FeRAM, PRAM, RRAM, nanotube RRAM, PoRAM, or an insulator resistance change memory.

For example, the semiconductor chip 520 may be mounted on the package substrate 510 so that the lower surface of the semiconductor chip 520 on which the chip pad 522 is provided faces a lower direction. For example, the lower surface of the semiconductor chip 520 faces an upper surface of the package substrate 510. The chip pad 522 of the semiconductor chip 520 may be used as a terminal for input/output data signal transmission or a terminal for power and/or the ground for the semiconductor chip 520.

The molding layer 541 is provided on the package substrate 510 and may cover at least a portion of the semiconductor chip 520. The molding layer 541 may protect the at least a portion of the semiconductor chip 520 from an external environment. In addition, the molding layer 541 may include an underfill part that fills a gap between the semiconductor chip 520 and the package substrate 510 and at least partially surrounds the chip connection terminal 521 between the semiconductor chip 520 and the package substrate 510.

For example, the molding layer 541 may be formed by injecting an appropriate amount of a molding material into the surroundings of the semiconductor chip 520 by an injection process and hardening the molding material by a hardening process. In an exemplary embodiment of the present inventive concept, the molding material for forming the molding layer 541 may include an epoxy-group molding resin, a polyimide-group molding resin, or the like. For example, the molding layer 541 may include an epoxy molding compound (EMC).

The interposer 600 may be arranged on the semiconductor chip 520 and the molding layer 541. The interposer 600 may include an interposer substrate 610. The interposer substrate 610 may include an interposer substrate base 612 made of at least one of a phenol resin, an epoxy resin, and polyimide. The interposer substrate 610 may include an interposer upper pad 614 and an interposer lower pad 611 respectively formed on an upper surface and a lower surface of the interposer substrate base 612. An interposer internal wiring 613 electrically connecting the interposer upper pad 614 to the interposer lower pad 611 may be formed inside the interposer substrate base 612.

The interposer upper pad 614 and the interposer lower pad 611 may include, for example, a metal such as Cu, Al, W, Ti, Ta, In, Mo, Mn, Co, Sn, Ni, Mg, Re, Be, Ga, or Ru or an alloy thereof, but the present inventive concept is not limited thereto. The interposer upper pad 614 may be an example of the upper pad 133 described above with reference to FIGS. 1A and 1B.

For example, the conductive connector 542 may be separated in a horizontal direction from a side wall of the semiconductor chip 520. The conductive connector 542 may be accommodated in a through hole of the molding layer 541. For example, the conductive connector 542 may have an approximate column shape extending in the vertical direction, e.g., a direction orthogonal to an upper surface of the package substrate 510. For example, the conductive connector 542 may have a cylindrical shape, cuboid shape, or a rounded shape.

A lower end of the conductive connector 542 may be connected to the substrate upper pad 514 of the package substrate 510, and an upper end of the conductive connector 542 may be connected to the interposer lower pad 611 on the lower surface of the interposer substrate base 612. The conductive connector 542 may electrically connect the substrate upper pad 514 of the package substrate 510 to the interposer lower pad 611 of the interposer substrate base 612.

For example, the conductive connector 542 may include at least one of solder, Al, Cu, Ni, W, platinum (Pt), and/or gold (Au).

In an exemplary embodiment of the present inventive concept, the first semiconductor package 30 may include a plurality of external connection terminals used for a single chip pad 522. For example, the chip pad 522 may be a pad through which the clock signal CK is output, and first and second external connection terminals 531 and 532 may be exclusively used for the clock signal CK. The first external connection terminal 531 may be connected to the chip pad 522 through the internal wiring 513. The second external connection terminal 532 may be connected to the interposer upper pad 614 through the internal wiring 513, the conductive connector 542, and the interposer internal wiring 613.

The internal wiring 513 connected to the chip pad 522 may be connected to the first external connection terminal 531 without being branched (or, e.g., divided) inside the package substrate 510. For example, the internal wiring 513 connected to the chip pad 522 may be connected to one external connection terminal. In an exemplary embodiment of the present inventive concept, a second semiconductor chip located outside the first semiconductor package 30 may exchange a signal with the semiconductor chip 520 through the first external connection terminal 531. For example, because a signal is exchanged through the internal wiring 513 which is not branched inside the package substrate 510, a signal distortion phenomenon due to a stub structure may be reduced. When the semiconductor chip 520 and the second semiconductor chip exchange a signal through the first external connection terminal 531, the second external connection terminal 532 might not transfer a signal output from the semiconductor chip 520. For example, the second external connection terminal 532 may be in a non-connection (NC) state.

In an exemplary embodiment of the present inventive concept, the second semiconductor chip located outside the first semiconductor package 30 may exchange a signal with the semiconductor chip 520 through the interposer upper pad 614. In this case, the first external connection terminal 531 and the second external connection terminal 532 may be electrically connected to each other outside the first semiconductor package 30. For example, by electrically connecting the first external connection terminal 531 and the second external connection terminal 532 to each other, a signal output from the chip pad 522 may be transferred to the second semiconductor chip through the interposer upper pad 614.

Referring to FIG. 3, the first and second external connection terminals 531 and 532 may be separated from each other by the minimum distance dmin. The minimum distance dmin may be a minimum distance between external connection terminals 531 and 532 formed on a lower surface of the first semiconductor package 30. Therefore, a signal path may be shortened even when the first and second external connection terminals 531 and 532 are electrically connected to each other outside the first semiconductor package 30, and thus, the semiconductor chip 520 and the second semiconductor chip may stably exchange a signal.

The first semiconductor package 30 according to an exemplary embodiment of the present inventive concept may include the internal wiring 513 which is not branched inside the package substrate 510, so that a stubless signal path may be provided regardless of a position of the second semiconductor chip which exchanges a signal with the semiconductor chip 520.

Figure 4A:
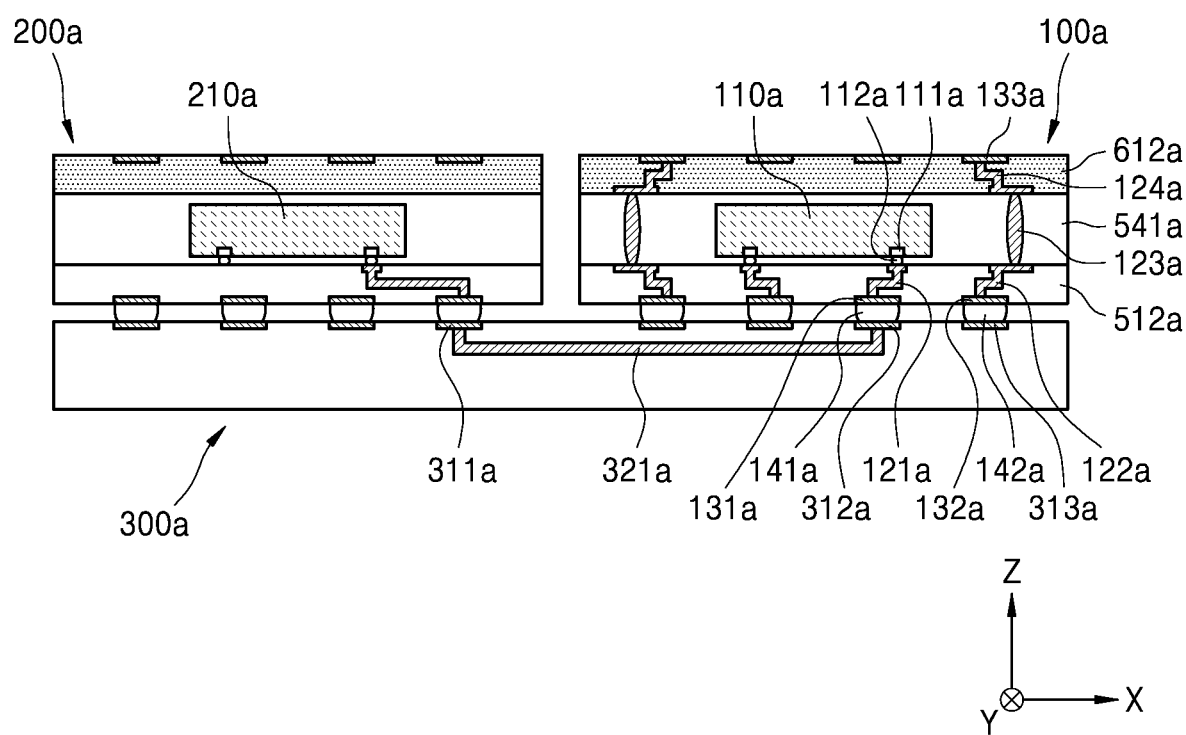
FIGS. 4A and 4B are cross-sectional views of semiconductor packages according to exemplary embodiments of the present inventive concept.
Figure 4B:
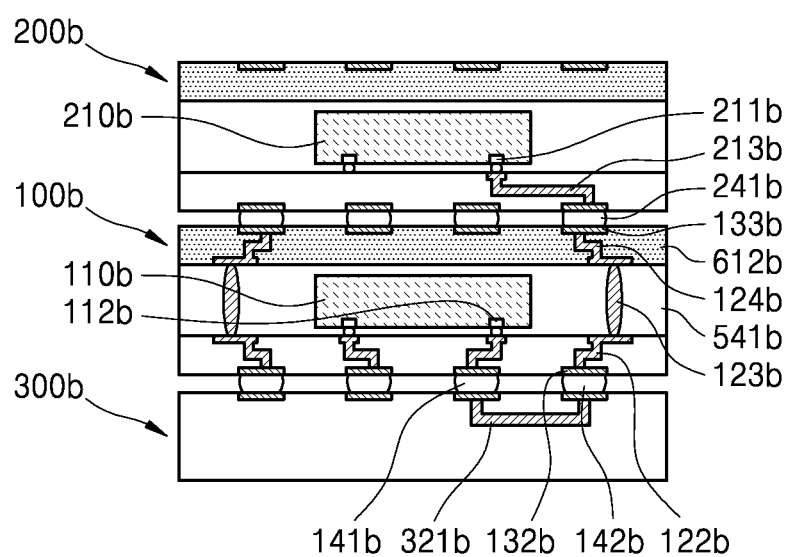

FIGS. 4A and 4B are cross-sectional views of semiconductor packages according to an exemplary embodiment of the present inventive concept. For example, FIG. 4A is a cross-sectional view of a semiconductor package 40a including a first semiconductor package 100a and a second semiconductor package 200a mounted on a semiconductor board 300a, and FIG. 4B is a cross-sectional view of a semiconductor package 40b including the second semiconductor package 200b mounted on a first semiconductor package 100b. The description made above with reference to FIGS. 1A and 1B may also be applied to FIGS. 4A and 4B. In addition, a description to be made with reference to FIG. 4A may also be applied to FIG. 4B.

Referring to FIG. 4A, the first semiconductor package 100a may include a first semiconductor chip 110a. For example, the first semiconductor chip 110a may be a non-memory chip. The first semiconductor package 100a may be the first semiconductor package 30 described above with reference to FIG. 3. The first semiconductor chip 110a may transmit or receive a pre-defined signal through a chip pad 111a. In an exemplary embodiment of the present inventive concept, the pre-defined signal may be one of a clock signal CK, a reset signal Rst, a data input signal D_in, and a data output signal D_out. The chip pad 111a may be connected to a first lower wiring structure 121a through a chip connection terminal 112a, and the first lower wiring structure 121a may be connected to a first substrate lower pad 131a. The first substrate lower pad 131a may be physically connected to a first external connection terminal 141a for transferring the pre-defined signal to the outside. The first lower wiring structure 121a may correspond to the first wiring structure 121 described above with reference to FIG. 1A.

The semiconductor board 300a may include first, second, and third package substrate pads 311a, 312a, and 313a. As shown in FIG. 4A, when the second semiconductor package 200a is mounted on the semiconductor board 300a, the semiconductor board 300a may include a substrate wiring structure 321a connecting the first package substrate pad 311a of the second semiconductor package 200a to the second package substrate pad 312a of the first semiconductor package 100a.

Referring to FIG. 4A, the first semiconductor package 100a may include structures corresponding to the second wiring structure 122 of FIG. 1A. For example, the first semiconductor package 100a may include a second lower wiring structure 122a, a conductive connector 123a, and an upper wiring structure 124a. The second lower wiring structure 122a, the conductive connector 123a, and the upper wiring structure 124a may be formed by a bypass structure of physically/electrically connecting a second substrate lower pad 132a to an interposer upper pad 133a. However, the present embodiment is not limited thereto, and the first semiconductor package 100a may include a vertical connection structure of physically/electrically connecting the second substrate lower pad 132a to the interposer upper pad 133a by passing through an interposer substrate 612a, a molding layer 541a, and a substrate base 512a. The vertical connection structure may be referred to as a through silicon via (TSV). The interposer upper pad 133a of FIG. 4A may correspond to the upper pad 133 of FIG. 1A. The second substrate lower pad 132a of FIG. 4A may correspond to the second lower pad 132 of FIG. 1A.

In an exemplary embodiment of the present inventive concept, the first lower wiring structure 121a may be separated from the second lower wiring structure 122a.

As shown in FIG. 4A, when the second semiconductor package 200a including a second semiconductor chip 210a is mounted on the semiconductor board 300a, a second external connection terminal 142a may be in the NC state. For example, the second external connection terminal 142a among the first and second external connection terminals 141a and 142a may not be connected to a wiring structure (e.g., the substrate wiring structure 321a) provided to the semiconductor board 300a. The second external connection terminal 142a may be connected to the interposer upper pad 133a through the upper wiring structure 124a, the conductive connector 123a, the second lower wiring structure 122a and the second substrate lower pad 132a.

Referring to FIG. 4B, a second semiconductor package 200b may be mounted on a first semiconductor package 100b. An external connection terminal 241b may be formed on a lower surface of the second semiconductor package 200b. The external connection terminal 241b may be formed based on a ball map for pre-defined signals. For example, the external connection terminal 241b may be formed at a pre-defined position on the lower surface of the second semiconductor package 200b to output or receive the clock signal CK, the reset signal Rst, the data input signal D_in, or the data output signal D_out.

An interposer upper pad 133b of the first semiconductor package 100b may be formed at a position corresponding to a ball map of the second semiconductor package 200b. A second semiconductor chip 210b may output a pre-defined signal through a chip pad 211b, and the pre-defined signal may be transferred to the external connection terminal 241b through a lower wiring structure 213b. The external connection terminal 241b may be connected to the interposer upper pad 133b of the first semiconductor package 100b. The pre-defined signal may be transferred to a second external connection terminal 142b through an upper wiring structure 124b, a conductive connector 123b, and a second lower wiring structure 122b. A first external connection terminal 141b and the second external connection terminal 142b may be electrically connected to each other through a substrate wiring structure 321b of a semiconductor board 300b. Therefore, the second semiconductor chip 210b and a first semiconductor chip 110b may exchange the pre-defined signal with each other.

Figure 5A:
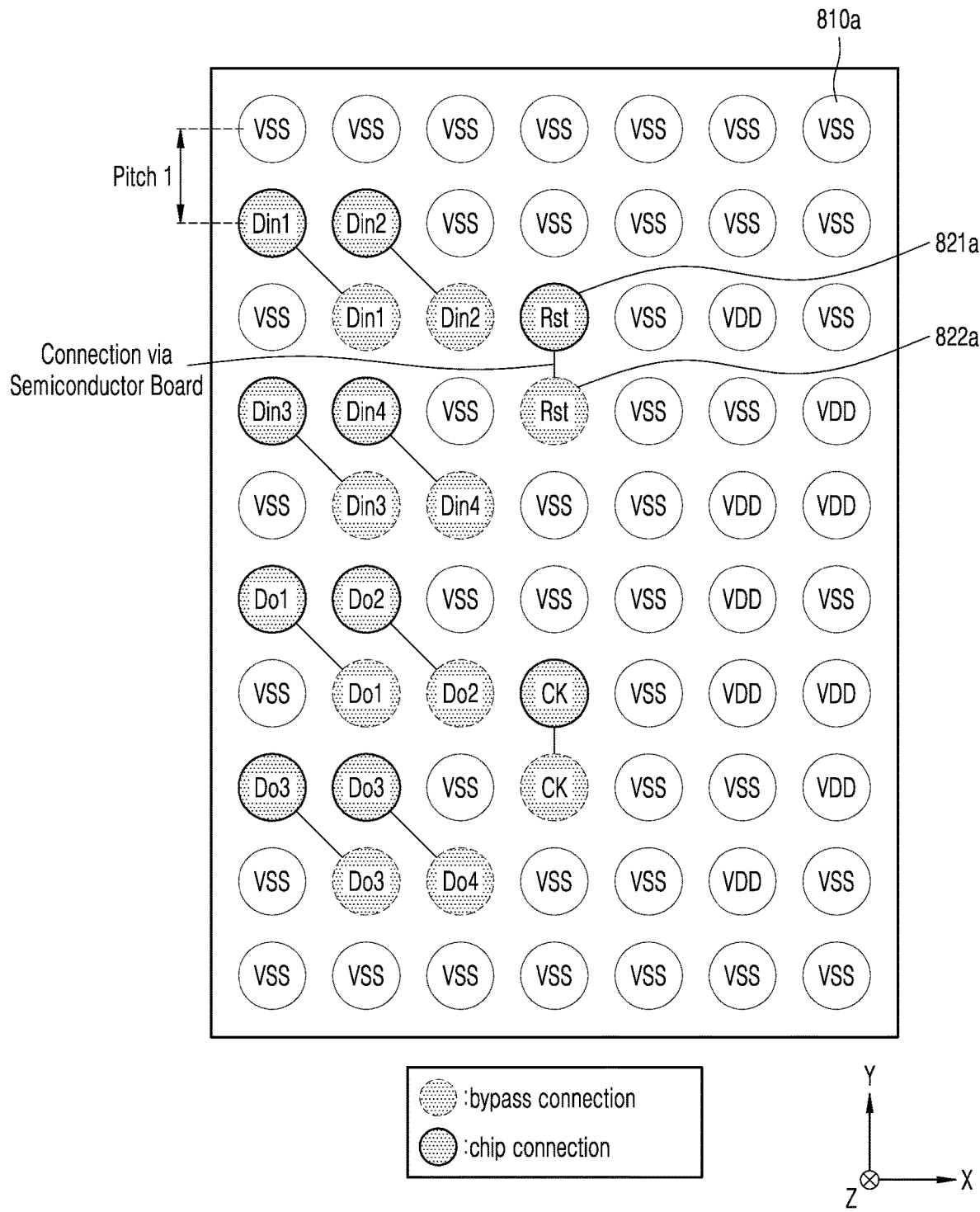
FIGS. 5A and 5B are bottom views of ball maps of a first semiconductor package, according to exemplary embodiments of the present inventive concept.
Figure 5B:
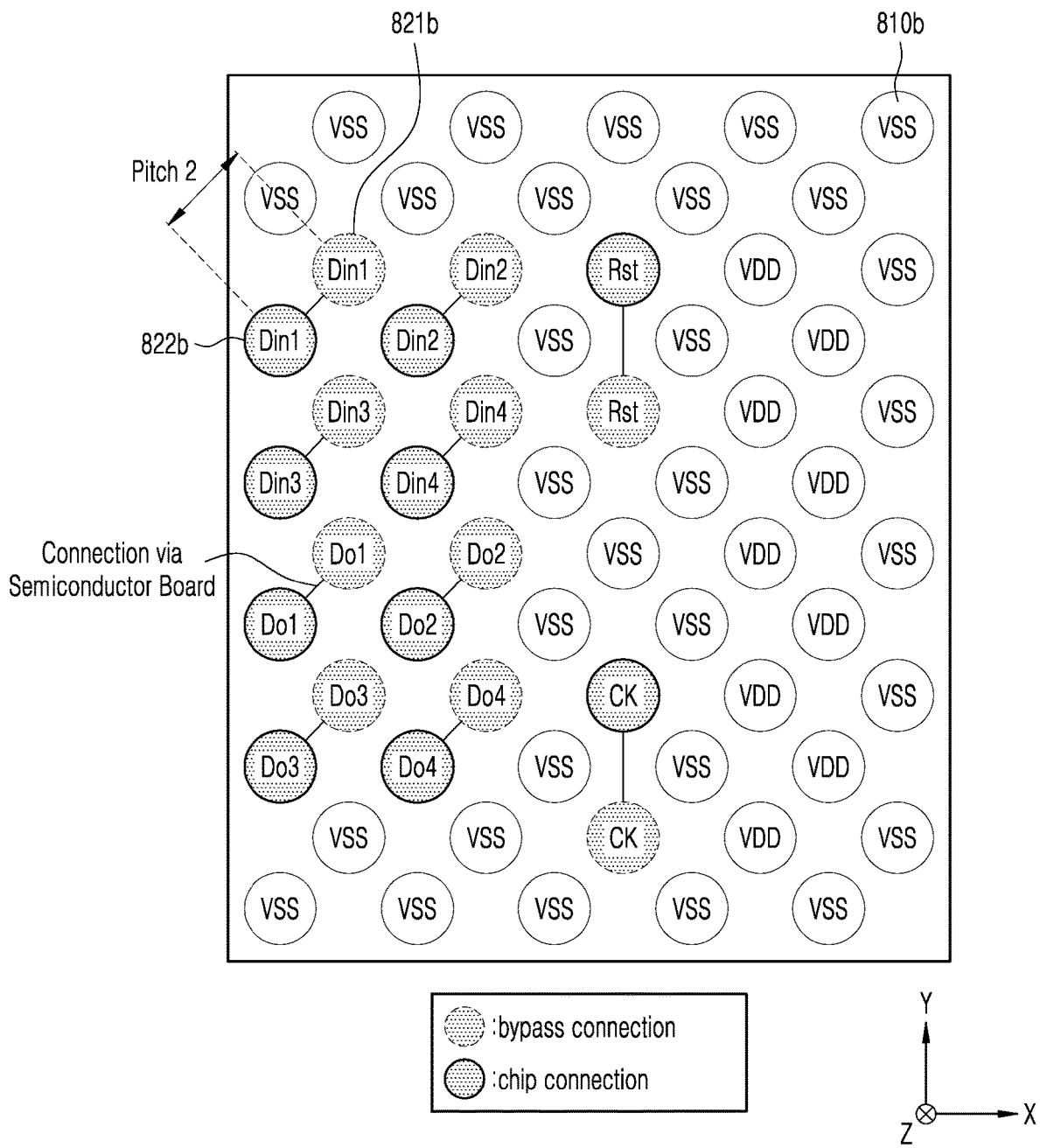

FIGS. 5A and 5B are bottom views of ball maps of a first semiconductor package, according to exemplary embodiments of the present inventive concept. For example, FIGS. 5A and 5B illustrate arrangements of external connection terminals formed on a lower surface of the first semiconductor package 100b shown in FIG. 4B. FIG. 5A illustrates an arrangement of external connection terminals having a minimum distance in the Y-axis direction and/or the X-axis direction. For example, FIG. 5A shows external connection terminals arranged in an orthogonal grid pattern. FIG. 5B illustrates an arrangement of external connection terminals having a minimum distance in a direction between the X-axis direction and the Y-axis direction. For example, FIG. 5B shows external connection terminals arranged in a diagonal grid pattern. For example, the arrangement of the external connection terminals may include rows and columns of external connection terminals, and the rows of external connection terminals may be misaligned with one another.

Referring to FIG. 5A, a plurality of external connection terminals 810a may be formed on the lower surface of the first semiconductor package 100b. Each of the plurality of external connection terminals 810a may receive or output a signal pre-defined according to a ball map. For example, each of the plurality of the external connection terminals 810a may receive or output a positive supply voltage VDD, a negative supply voltage VSS, a clock signal CK, a reset signal Rst, one of first to fourth data input signals Din1 to Din4, or one of first to fourth data output signals Do1 to Do4.

According to an exemplary embodiment of the present inventive concept, external connection terminals dualized for one signal may be formed on the lower surface of the first semiconductor package 100b. For example, dualized first and second external connection terminals 821a and 822a corresponding to the reset signal Rst may be formed on the lower surface of the first semiconductor package 100b. However, the present embodiment is not limited thereto, and dualized external connection terminals corresponding to each of the positive supply voltage VDD, the negative supply voltage VSS, the reference clock signal CK, the first to fourth data input signals Din1 to Din4, or the first to fourth data output signals Do1 to Do4 may be formed.

As described above with reference to FIG. 4B, the first external connection terminal 821a may be connected to a chip pad 112b of the first semiconductor chip 110b included in the first semiconductor package 100b. For example, because the first external connection terminal 821a is connected to the first semiconductor chip 110b, the first external connection terminal 821a may be referred to as a chip connection external connection terminal. The second external connection terminal 822a may be connected to an interposer substrate 612b formed on an upper surface of the molding layer 541b. For example, because the second external connection terminal 822a is connected to a bypass structure passing through the first semiconductor package 100b, the second external connection terminal 822a may be referred to as a bypass connection external connection terminal. The dualized first and second external connection terminals 821a and 822a may be electrically connected to each other by the substrate wiring structure 321b formed in the semiconductor board 300b.

Referring to FIG. 5A, the dualized first and second external connection terminals 821a and 822a may be separated from each other by a first distance Pitch 1. The first distance Pitch 1 may be a minimum distance between the plurality of external connection terminals 810a formed on the lower surface of the first semiconductor package 100b. Although FIG. 5A shows that the first distance Pitch 1 is a distance in the Y-axis direction, in an exemplary embodiment of the present inventive concept, the first distance Pitch 1 may be a distance in the X-axis direction. Because the first and second external connection terminals 821a and 822a are arranged at the minimum distance, a signal path may be shortened, and the first semiconductor chip 110b and the second semiconductor chip 210b may stably exchange a signal between one another. In an exemplary embodiment of the present inventive concept, unlike FIG. 5A, not only are the first and second external connection terminals 821a and 822a corresponding to the reset signal Rst separated from each other by the first distance Pitch 1, but also dualized external connection terminals corresponding to each of the reference clock signal CK, the first to fourth data input signals Din1 to Din4, and the first to fourth data output signals Do1 to Do4 may be separated from each other by the first distance Pitch 1.

Referring to FIG. 5B, external connection terminals dualized for one signal may be formed on the lower surface of the first semiconductor package 100b. For example, first and second external connection terminals 821b and 822b dualized for the first data input signal Din1 may be formed on the lower surface of the first semiconductor package 100b.

Unlike FIG. 5A, the dualized first and second external connection terminals 821b and 822b of FIG. 5B may be separated from each other by a second distance Pitch 2. The second distance Pitch 2 may be a minimum distance between a plurality of external connection terminals 810b formed on the lower surface of the first semiconductor package 100b. Unlike the first distance Pitch 1 of FIG. 5A, the second distance Pitch 2 may be a minimum distance in a direction between the X-axis direction and the Y-axis direction. Because the first and second external connection terminals 821b and 822b are arranged at the minimum distance, a signal path may be shortened, and the first semiconductor chip 110b and the second semiconductor chip 210b may stably exchange a signal between one another.

Figure 6A:
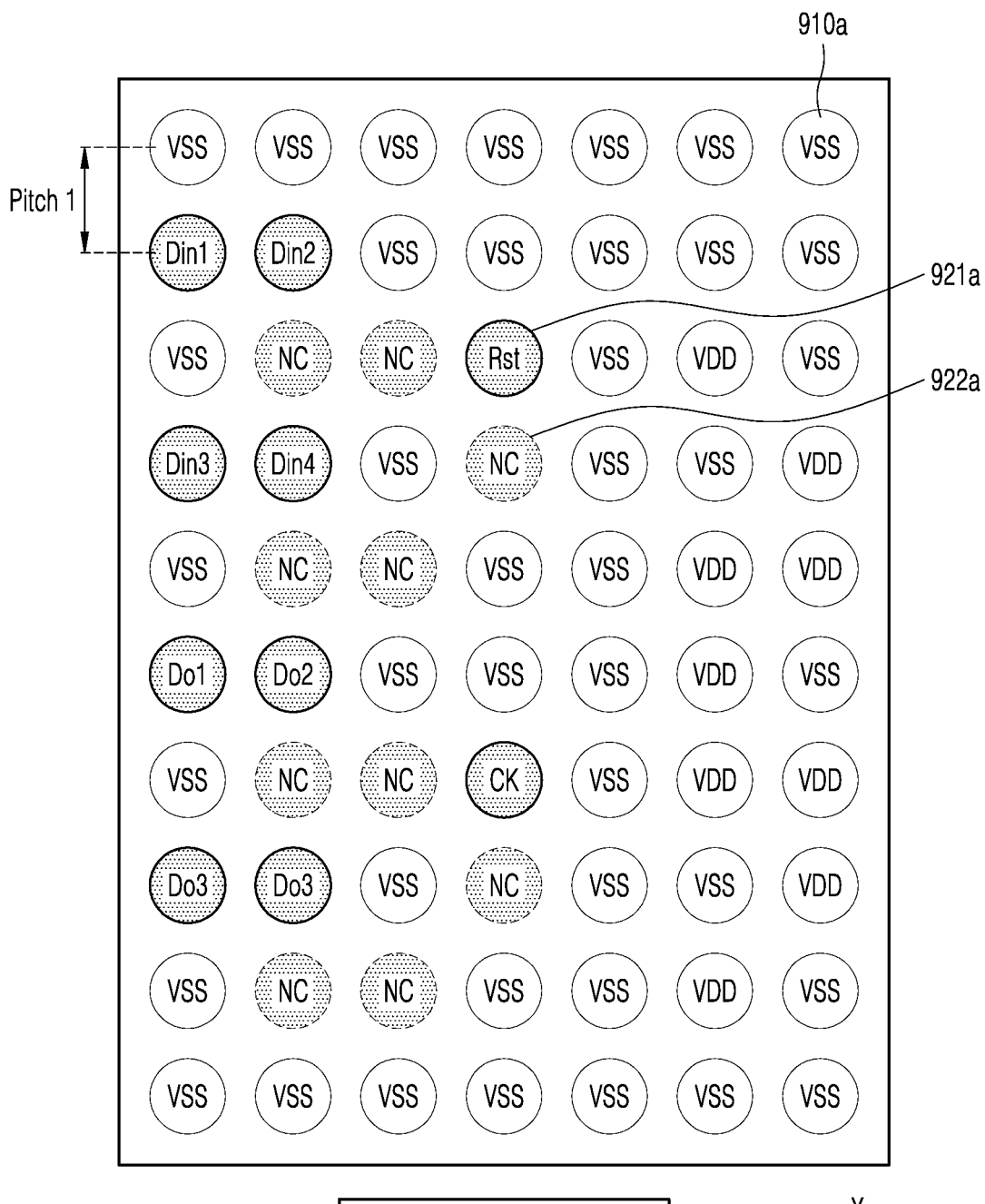
FIGS. 6A and 6B are bottom views of ball maps of a first semiconductor package, according to exemplary embodiments of the present inventive concept.
Figure 6B:
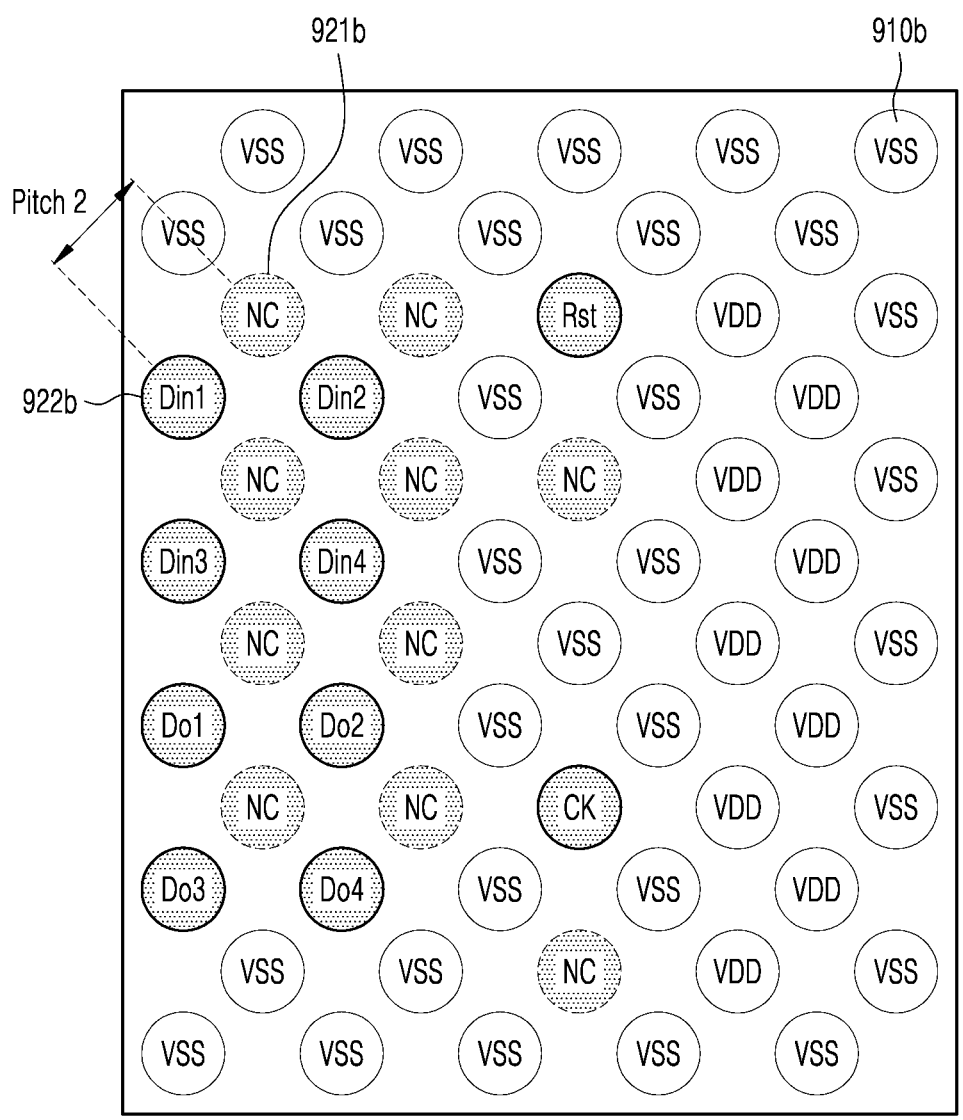

FIGS. 6A and 6B are bottom views of ball maps of a first semiconductor package, according to exemplary embodiments of the present inventive concept. For example, FIGS. 6A and 6B illustrate arrangements of external connection terminals formed on a lower surface of the first semiconductor package 100a shown in FIG. 4A. FIG. 6A illustrates an arrangement of external connection terminals having a minimum distance in the Y-axis direction and/or the X-axis direction. For example, FIG. 6A shows external connection terminals arranged in an orthogonal grid pattern. FIG. 6B illustrates an arrangement of external connection terminals having a minimum distance in a direction between the X-axis direction and the Y-axis direction. For example, FIG. 6B shows external connection terminals arranged in a diagonal grid pattern. For example, the arrangement of the external connection terminals may include rows and columns of external connection terminals, and the rows of external connection terminals may be misaligned with one another. A description made with reference to FIGS. 5A and 5B will not be repeated.

Referring to FIG. 6A, a second external connection terminal 922a may be in the NC state. For example, the second external connection terminal 922a might not be connected to a wiring structure (e.g., the substrate wiring structure 321a of FIG. 4A) included in the substrate base 512a. In addition, unlike FIG. 5A, a first external connection terminal 921a and the second external connection terminal 922a formed on the lower surface of the first semiconductor package 100a may be electrically isolated from each other. For example, the first semiconductor chip 110a and the second semiconductor chip 210a may stably exchange a signal through a signal path without a stub structure.

Figure 7:
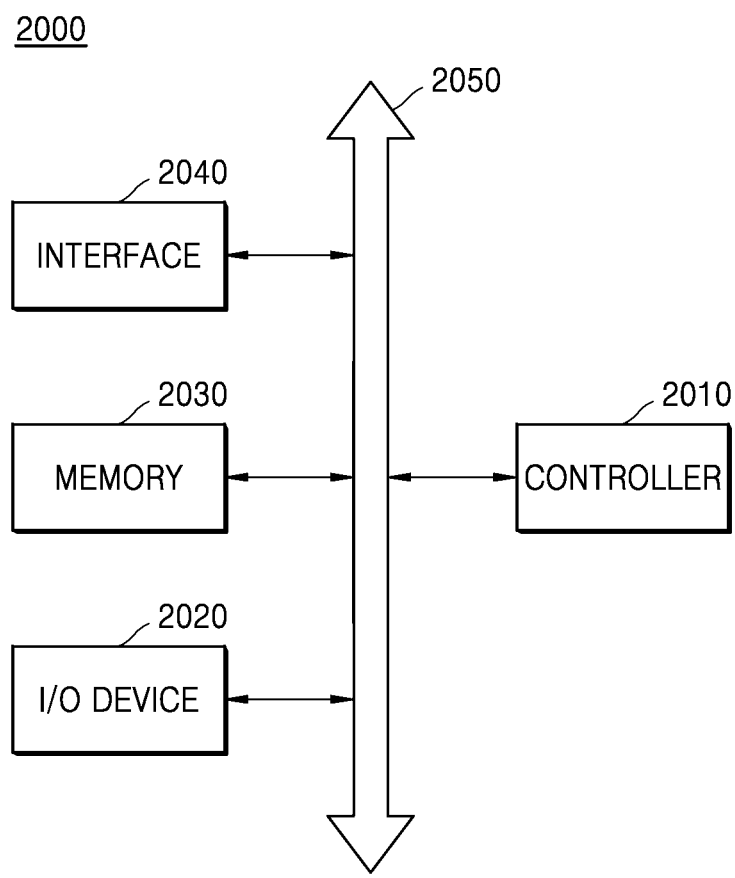
FIG. 7 is a block diagram of an electronic system according to an exemplary embodiment of the present inventive concept.

FIG. 7 is a block diagram of an electronic system 2000 according to an exemplary embodiment of the present inventive concept.

The electronic system 2000 may include a controller 2010, an input/output (I/O) device 2020, a memory 2030, and an interface 2040, and the controller 2010, the I/O device 2020, the memory 2030, and the interface 2040 may be connected to each other via a bus 2050.

For example, the controller 2010 may include at least one of a microprocessor, a digital signal processor, or a processing device similar thereto. The I/O device 2020 may include, for example, at least one of a keypad, a keyboard, and/or a display. The memory 2030 may be used to store a command executed by the controller 2010. For example, the memory 2030 may be used to store user data.

The electronic system 2000 may form a wireless communication device or a device capable of transmitting and/or receiving information in a wireless environment. For the electronic system 2000 to transmit/receive data through a wireless communication network, the interface 2040 may include a wireless communication interface. The interface 2040 may include, for example, an antenna and/or a wireless transceiver. In an exemplary embodiment of the present inventive concept, the electronic system 2000 may be used for a communication interface protocol of a third-generation communication system, e.g., code division multiple access (CDMA), global system for mobile communications (GSM), north American digital cellular (NADC), extended-time division multiple access (E-TDMA), and/or wideband code division multiple access (WCDMA). The controller 2010 may be implemented by the first semiconductor package 100, 100a, or 100b described above with reference to FIG. 1A, 1B, 4A, or 4B or the first semiconductor package 30 described above with reference to FIG. 3. The memory 2030 may be implemented by the second semiconductor package 200, 200a, or 200b described above with reference to FIG. 1A, 1B, 4A, or 4B.

Figure 8:
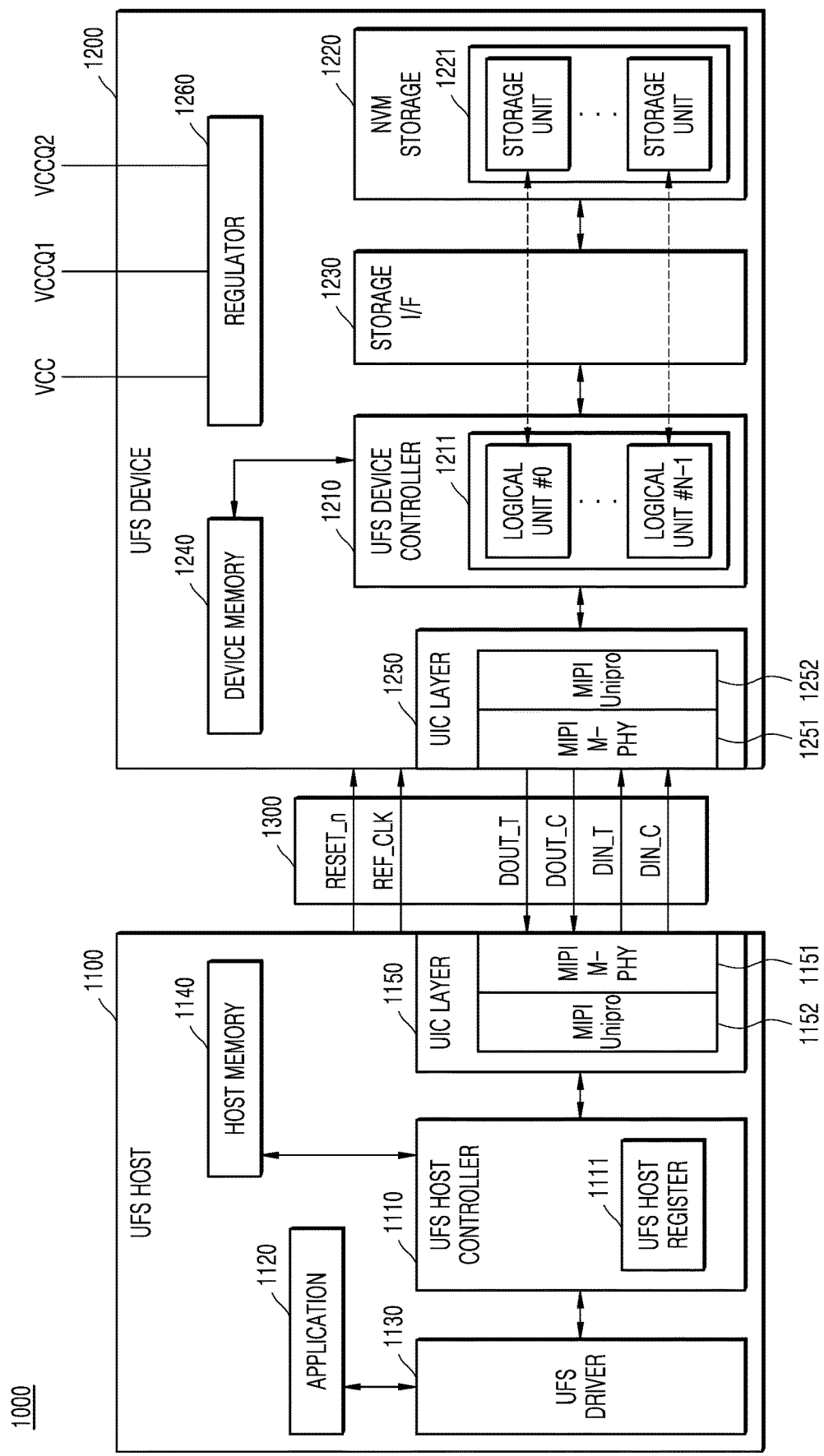
FIG. 8 is a block diagram of a universal flash storage (UFS) system according to an exemplary embodiment of the present inventive concept.

FIG. 8 is a diagram of a Universal Flash Storage (UFS) system 1000 according to an exemplary embodiment of the present inventive concept. The UFS system 1000 may be a system conforming to a UFS standard announced by the Joint Electron Device Engineering Council (JEDEC) and include a UFS host 1100, a UFS device 1200, and a UFS interface 1300. The UFS host 1100 may be included in a first semiconductor package 100, 100a, 100b described above with reference to FIG. 1A, 1B, 4A or 4B or the first semiconductor package 30 described above with reference to FIG. 3. The UFS host 1100 may be included in a semiconductor chip 520 of FIG. 3. The UFS device 1200 may be included in the second semiconductor package 200, 200a or 200b described above with reference to FIG. 1A, 1B, 4A or 4B.

Referring to FIG. 8, the UFS host 1100 may be connected to the UFS device 1200 through the UFS interface 1300. The UFS host controller 1110 may correspond to the memory controller 120 of FIGS. 1A and 1B. The UFS device 1200 may correspond to the memory device 210 of FIGS. 1A and 1B.

The UFS host 1100 may include a UFS host controller 1110, an application 1120, a UFS driver 1130, a host memory 1140, and a UFS interconnect (UIC) layer 1150. The UFS device 1200 may include the UFS device controller 1210, a non-volatile memory (NVM) storage 1220, a storage interface 1230, a device memory 1240, a UIC layer 1250, and a regulator 1260. The NVM storage 1220 may include a plurality of memory units 1221. Although each of the memory units 1221 may include a V-NAND flash memory having a 2D structure or a 3D structure, each of the memory units 1221 may include another kind of NVM, such as PRAM and/or RRAM. The UFS device controller 1210 may be connected to the NVM storage 1220 through the storage interface 1230. The storage interface 1230 may be configured to comply with a standard protocol, such as Toggle or ONFI.

The application 1120 may refer to a program that wants to communicate with the UFS device 1200 to use functions of the UFS device 1200. The application 1120 may transmit input-output requests (IORs) to the UFS driver 1130 for input/output (I/O) operations on the UFS device 1200. The IORs may refer to a data read request, a data storage (or write) request, and/or a data erase (or discard) request, without being limited thereto.

The UFS driver 1130 may manage the UFS host controller 1110 through a UFS-host controller interface (UFS-HCI). The UFS driver 1130 may convert the IOR generated by the application 1120 into a UFS command defined by the UFS standard and transmit the UFS command to the UFS host controller 1110. One IOR may be converted into a plurality of UFS commands. Although the UFS command may basically be defined by an SCSI standard, the UFS command may be a command dedicated to the UFS standard.

The UFS host controller 1110 may transmit the UFS command converted by the UFS driver 1130 to the UIC layer 1250 of the UFS device 1200 through the UIC layer 1150 of the UFS host 1100 and the UFS interface 1300. During the transmission of the UFS command, a UFS host register 1111 of the UFS host controller 1110 may serve as a command queue (CQ).

The UIC layer 1150 on the side of the UFS host 1100 may include a mobile industry processor interface (MIPI) M-PHY 1151 and an MIPI UniPro 1152, and the UIC layer 1250 on the side of the UFS device 1200 may also include an MIPI M-PHY 1251 and an MIPI UniPro 1252.

The UFS interface 1300 may include a line configured to transmit a reference clock signal REF_CLK, a line configured to transmit a hardware reset signal RESET_n for the UFS device 1200, a pair of lines configured to transmit a pair of differential input signals DIN_T and DIN_C, and a pair of lines configured to transmit a pair of differential output signals DOUT_T and DOUT_C. For example, referring to FIGS. 5A to 6B, the line configured to transmit the hardware reset signal RESET_n may include double external connection terminals for a reset RST signal. The pair of lines configured to transmit the pair of differential input signals DIN_T and DIN_C may include double external connection terminals for a first data input Din1 to a fourth data input Din4 signal, respectively. The pair of lines configured to transmit the pair of differential output signals DOUT_T and DOUT_C may include double external connection terminals for a first data output Do1 to a fourth data output Do4 signal, respectively.

The hardware reset signal RESET_n may include double external connection terminals for a reset RST signal.

A frequency of a reference clock signal REF_CLK provided from the UFS host 1100 to the UFS device 1200 may be one of, for example, 19.2 MHz, 26 MHz, 38.4 MHz, and 52 MHz, without being limited thereto. The UFS host 1100 may change the frequency of the reference clock signal REF_CLK during an operation, for example, during data transmission/receiving operations between the UFS host 1100 and the UFS device 1200. The UFS device 1200 may generate clock signals having various frequencies from the reference clock signal REF_CLK provided from the UFS host 1100, by using a phase-locked loop (PLL). In addition, the UFS host 1100 may set a data rate between the UFS host 1100 and the UFS device 1200 by using the frequency of the reference clock signal REF_CLK. For example, the data rate may be determined depending on the frequency of the reference clock signal REF_CLK.

The UFS interface 1300 may support a plurality of lanes, each of which may be implemented as a pair of differential lines. For example, the UFS interface 1300 may include at least one receiving lane and at least one transmission lane. In FIG. 8, a pair of lines configured to transmit a pair of differential input signals DIN_T and DIN_C may constitute a receiving lane, and a pair of lines configured to transmit a pair of differential output signals DOUT_T and DOUT_C may constitute a transmission lane. Although one transmission lane and one receiving lane are illustrated in FIG. 8, the number of transmission lanes and the number of receiving lanes may be changed.

The receiving lane and the transmission lane may transmit data based on a serial communication scheme. Full-duplex communications between the UFS host 1100 and the UFS device 1200 may be enabled due to a structure in which the receiving lane is separated from the transmission lane. For example, while receiving data from the UFS host 1100 through the receiving lane, the UFS device 1200 may transmit data to the UFS host 1100 through the transmission lane. In addition, control data (e.g., a command) from the UFS host 1100 to the UFS device 1200 and user data to be stored in or read from the NVM storage 1220 of the UFS device 1200 by the UFS host 1100 may be transmitted through the same lane. Accordingly, between the UFS host 1100 and the UFS device 1200, there may be no need to further provide a separate lane for data transmission in addition to a pair of receiving lanes and a pair of transmission lanes.

The UFS device controller 1210 of the UFS device 1200 may control all operations of the UFS device 1200. The UFS device controller 1210 may manage the NVM storage 1220 by using a logical unit (LU) 1211, which is a logical data storage unit. The number of LUs 2211 may be, for example, 8, without being limited thereto. The UFS device controller 1210 may include a flash translation layer (FTL) and convert a logical data address (e.g., a logical block address (LBA)) received from the UFS host 1100 into a physical data address (e.g., a physical block address (PBA)) by using address mapping information of the FTL. A logical block configured to store user data in the UFS system 1000 may have a size in a predetermined range. For example, a minimum size of the logical block may be set to about 4 Kbyte.

When a command from the UFS host 1100 is applied through the UIC layer 1250 to the UFS device 1200, the UFS device controller 1210 may perform an operation in response to the command and transmit a completion response to the UFS host 1100 when the operation is completed.

As an example, when the UFS host 1100 intends to store user data in the UFS device 1200, the UFS host 1100 may transmit a data storage command to the UFS device 1200. When a response (e.g., a 'ready-to-transfer' response) indicating that the UFS host 1100 is ready to receive user data (ready-to-transfer) is received from the UFS device 1200, the UFS host 1100 may transmit user data to the UFS device 1200. The UFS device controller 1210 may temporarily store the received user data in the device memory 1240 and store the user data, which is temporarily stored in the device memory 1240, at a selected position of the NVM storage 1220 based on the address mapping information of the FTL.

As another example, when the UFS host 1100 intends to read the user data stored in the UFS device 1200, the UFS host 1100 may transmit a data read command to the UFS device 1200. The UFS device controller 1210, which has received the command, may read the user data from the NVM storage 1220 based on the data read command and temporarily store the read user data in the device memory 1240. During the read operation, the UFS device controller 1210 may detect and correct an error in the read user data by using an error correction code (ECC) engine embedded therein. For example, the ECC engine may generate parity bits for write data to be written to the NVM storage 1220, and the generated parity bits may be stored in the NVM storage 1220 along with the write data. During the reading of data from the NVM storage 1220, the ECC engine may correct an error in read data by using the parity bits read from the NVM storage 1220 along with the read data, and output error-corrected read data.

In addition, the UFS device controller 1210 may transmit user data, which is temporarily stored in the device memory 1240, to the UFS host 1100. In addition, the UFS device controller 1210 may further include an advanced encryption standard (AES) engine. The AES engine may perform at least one of an encryption operation or a decryption operation on data transmitted to the UFS device controller 1210 by using a symmetric-key algorithm.

The UFS host 1100 may sequentially store commands, which are to be transmitted to the UFS device 1200, in the UFS host register 1111, which may serve as a common queue, and sequentially transmit the commands to the UFS device 1200. In this case, even while a previously transmitted command is still being processed by the UFS device 1200, for example, even before receiving a notification that the previously transmitted command has been processed by the UFS device 1200, the UFS host 1100 may transmit a next command, which is on standby in the CQ, to the UFS device 1200. Thus, the UFS device 1200 may also receive a next command from the UFS host 1100 during the processing of the previously transmitted command. A maximum number (or, e.g., queue depth) of commands that may be stored in the CQ may be, for example, 32. In addition, the CQ may be implemented as a circular queue in which a start and an end of a command line stored in a queue are indicated by a head pointer and a tail pointer.

Each of the plurality of memory units 1221 may include a memory cell array and a control circuit configured to control an operation of the memory cell array. For example, the memory cell array may include a 2D memory cell array or a 3D memory cell array. The memory cell array may include a plurality of memory cells. Although each of the memory cells is a single-level cell (SLC) configured to store 1-bit information, each of the memory cells may be a cell configured to store information of 2 bits or more, such as a multi-level cell (MLC), a triple-level cell (TLC), and a quadruple-level cell (QLC). The 3D memory cell array may include a vertical NAND string in which at least one memory cell is vertically oriented and located on another memory cell.

Voltages VCC, VCCQ1, and VCCQ2 may be applied as power supply voltages to the UFS device 1200. The voltage VCC may be a main power supply voltage for the UFS device 1200 and be in a range of about 2.4 V to about 3.6 V. The voltage VCCQ1 may be a power supply voltage for supplying a low voltage mainly to the UFS device controller 1210 and be in a range of about 1.14 V to about 1.26 V. The voltage VCCQ2 may be a power supply voltage for supplying a voltage, which is lower than the voltage VCC and higher than the voltage VCCQ1, mainly to an I/O interface, such as the MIPI M-PHY 2251, and be in a range of about 1.7 V to about 1.95 V. The power supply voltages may be supplied through the regulator 1260 to respective components of the UFS device 1200. For example, the regulator 1260 may be implemented as a set of unit regulators respectively connected to different ones of the power supply voltages described above.

While the present inventive concept has been described with reference to embodiments thereof, it will be understood by those of ordinary skill in the art that various changes in form and details may be made thereto without departing from the spirit and scope of the present inventive concept.

What is claimed is:

1. A semiconductor package comprising:
   a plurality of lower pads;
   a plurality of upper pads;
   a semiconductor chip including a chip pad and configured to transmit a first signal through the chip pad to a memory chip included in a memory package or receive the first signal through the chip pad from the memory chip included in the memory package;
   a first wiring structure connecting the chip pad to a first lower pad among the plurality of lower pads; and a plurality of second wiring structures connecting a plurality of second lower pads among the plurality of lower pads to the plurality of upper pads, the plurality of second wiring structures respectively including a plurality of conductive connectors that face side surfaces of the semiconductor chip,
a first external connection terminal connected to the first lower pad; and
a plurality of second external connection terminals respectively connected to the plurality of second lower pads,
wherein the first lower pad and one of the plurality of second lower pads are separated from each other by a minimum distance between the plurality of lower pads,
wherein when the semiconductor package and the memory package are horizontally mounted on a substrate base, the first wiring structure and the plurality of second wiring structures are electrically separated, the first external connection terminal is connected to a wiring structure transferring the first signal is formed in the substrate base, the plurality of second external connection terminals are electrically separated to the wiring structure, the semiconductor chip is laterally disposed between the plurality of conductive connectors, and none of the plurality of conductive connectors are electrically connected to the semiconductor chip.

2. The semiconductor package of claim 1, further comprising:
a package substrate comprising the plurality of lower pads;
a molding layer formed on the package substrate, wherein the semiconductor chip is arranged in the molding layer, and the molding layer covers at least a portion of the semiconductor chip; and
an interposer formed on the molding layer and comprising the plurality of upper pads,
wherein the first wiring structure passes through the package substrate, and
the plurality of second wiring structures pass through the package substrate, the molding layer, and the interposer.

3. The semiconductor package of claim 2, wherein the second wiring structure comprises:
an internal wiring formed in the package substrate;
the plurality of conductive connectors passing through the molding layer; and
an interposer internal wiring formed in the interposer.

4. The semiconductor package of claim 1,
wherein the first external connection terminal and one of the plurality of second external connection terminals are separated from each other by the minimum distance.

5. The semiconductor package of claim 1, wherein when the semiconductor package and the memory package is vertically mounted on the substrate base, the first external connection terminal and one of the plurality of second external connection terminals are connected to each other through the wiring structure formed in the substrate base.

6. The semiconductor package of claim 1, wherein the first signal is a reference clock signal, a reset signal, a data input signal, or a data output signal.

7. The semiconductor package of claim 6, wherein the semiconductor chip comprises a universal flash storage (UFS) controller configured to exchange the first signal through the chip pad.

8. The semiconductor package of claim 1, wherein the plurality of lower pads are arranged in an orthogonal grid pattern.

9. The semiconductor package of claim 1, wherein the plurality of lower pads are arranged into rows and columns, and the rows of the plurality of lower pads are misaligned with one another.

10. A semiconductor package comprising:
a substrate;
a first package comprising a plurality of lower pads, plurality of upper pads formed on an upper external surface of the first package, and a first semiconductor chip including a first chip pad and configured to transmit or receive a pre-defined signal through the first chip pad, and mounted on the substrate; and
a second package comprising a second semiconductor chip controlled by the first semiconductor chip and configured to transmit or receive a pre-defined signal through a second chip pad of the second semiconductor chip, and mounted on the first package or the substrate,
wherein the first package comprises:
a first wiring structure connecting the first chip pad to a first lower pad among the plurality of lower pads;
a plurality of second wiring structures connecting a plurality of second lower pads among the plurality of lower pads to the upper pad, the plurality of second wiring structures respectively including a plurality of conductive connectors that face side surfaces of the semiconductor chip,
a first external connection terminal connected to the first lower pad; and
a plurality of second external connection terminals respectively connected to the plurality of second lower pads,
wherein, when the first package and the second package are horizontally mounted on the substrate, the first wiring structure and the plurality of second wiring structures are electrically separated, the first external connection terminal is connected to a wiring structure formed in the substrate, the wiring structure transmit or receive the pre-defined signal between the first semiconductor chip and the second semiconductor chip, the plurality of second external connection terminals are electrically separated to the wiring structure the first semiconductor chip is laterally disposed between the plurality of conductive connectors, and none of the plurality of conductive connectors are electrically connected to the first semiconductor chip.

11. The semiconductor package of claim 10, wherein the first wiring structure and the plurality of second wiring structures are physically separated from each other in the first package.

12. The semiconductor package of claim 10, wherein, when the first package and the second package is horizontally mounted on the substrate, the plurality of second wiring structures are not connected to the wiring structure.

13. The semiconductor package of claim 10, wherein the second package comprises a plurality of external connection terminals electrically connected to chip pads of the second semiconductor chip, arranged according to a pre-defined ball map, and formed on a lower surface of the second package, wherein the chip pads include the second chip pad, and
the plurality of upper pads are arranged on an upper surface of the first package to correspond to the pre-defined ball map.

14. The semiconductor package of claim 10, wherein the first lower pad and one of the plurality of second lower pads are arranged by being separated from each other by a minimum distance between the plurality of lower pads.

15. The semiconductor package of claim 10, wherein the first semiconductor chip comprises a universal flash storage (UFS) host, and
the second semiconductor chip comprises a UFS device.

16. A semiconductor package comprising:
a plurality of lower pads;
a plurality of upper pads;
a semiconductor chip including a chip pad and configured to transmit a first signal through the chip pad to a memory chip included in a memory package or receive the first signal through the chip pad from the memory chip included in the memory package;
a first wiring structure connecting the chip pad to a first lower pad among the plurality of lower pads; and
a plurality of second wiring structures respectively connecting a plurality of second lower pads among the plurality of lower pads to the plurality of upper pads, the plurality of second wiring structures respectively including a plurality of conductive connectors that face side surfaces of the semiconductor chip,
a first external connection terminal connected to the first lower pad; and
a plurality of second external connection terminals respectively connected to the plurality of second lower pads,
wherein the first lower pad and one of the plurality of second lower pads are physically separated from each other in the semiconductor package, and the first wiring structure and the plurality of second wiring structures are physically separated from each other in the semiconductor package,
wherein the semiconductor chip comprises a universal flash storage (UFS) controller configured to exchange the first signal through the chip pad,
wherein when the semiconductor package and the memory package are horizontally mounted on a substrate base, the first wiring structure and the plurality of second wiring structures are electrically separated, the first external connection terminal is connected to a wiring structure formed in the substrate base, the plurality of second external connection terminals are electrically separated to the wiring structure, the semiconductor chip is laterally disposed between the plurality of conductive connectors, and none of the plurality of conductive connectors are electrically connected to the semiconductor chip.

17. The semiconductor package of claim 16 wherein the first external connection and the wiring structure are used for transferring the first signal.

18. The semiconductor package of claim 16, wherein the first lower pad and one of the plurality of second lower pads are separated from each other by a minimum distance between the plurality of lower pads.

* * * * *